United States Patent [19]
Gunther et al.

[11] Patent Number: 6,083,037
[45] Date of Patent: *Jul. 4, 2000

[54] CONTACT ELEMENT FOR ELECTRICAL CONTACT OF PRINTED CIRCUIT BOARDS TO A FRONT MODULE RAIL OF A MODULE SUPPORT STRUCTURE

[75] Inventors: Hans-Ulrich Gunther, Pfinztal; Paul Mazura, Karlsbad; Volker Haag, Bad Wildbad; Klaus Pfeifer, Karlsruhe; Klaus-Michael Thalau, Malsch; Michael Joist, Gaggenau, all of Germany; Udo Weiss, Straubenhardt, Germany

[73] Assignee: Schroff GmbH, Straubenhardt, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/957,439

[22] Filed: Oct. 24, 1997

[30] Foreign Application Priority Data

Oct. 25, 1996 [DE] Germany .............................. 196 44 416

[51] Int. Cl.[7] ....................................................... H01R 4/24
[52] U.S. Cl. ............................................. 439/443; 439/720
[58] Field of Search ............................... 439/59–62, 720, 439/721, 722, 733.1, 740, 741, 742, 746, 757, 872–3, 885, 442, 443, 444

[56] References Cited

U.S. PATENT DOCUMENTS

| | | |
|---|---|---|
| 5,022,863 | 6/1991 | Keens et al. . |
| 5,152,700 | 10/1992 | Bogursky et al. ....................... 439/733 |
| 5,286,218 | 2/1994 | Sakurai et al. ........................... 439/444 |
| 5,403,215 | 4/1995 | Butcher et al. .......................... 439/869 |
| 5,569,046 | 10/1996 | Pfetzer .................................... 439/443 |
| 5,688,149 | 11/1997 | Aihara ................................. 439/733.1 |

FOREIGN PATENT DOCUMENTS

| | | |
|---|---|---|
| 0 025 953 A1 | 4/1981 | European Pat. Off. . |
| 41 27 898 A1 | 2/1993 | Germany . |
| WO 94/14306 | 6/1994 | WIPO . |

*Primary Examiner*—Lincoln Donovan
*Attorney, Agent, or Firm*—Merchant & Gould P.C.

[57] ABSTRACT

A contact element having at least one leaf spring 2,3 has a U-shaped contact means 6, the two U-legs 8,9 of which taper towards their ends and can be elastically deformed with respect to each other. This contact element 1 is introduced into a guide groove 22 of a guide rail 13 of a module support structure or the like. The leaf springs 2,3 thereby contact a printed circuit board which can be inserted into the module support structure and the contact means 6, together with guide rail 13, can be clamped in a positioning hole 15 of a module rail 16 of the module support structure to thereby establish electrical contact with the module rail 16. In this manner, the interfering effect of an anodized layer on the module rail 16 is circumvented.

4 Claims, 4 Drawing Sheets

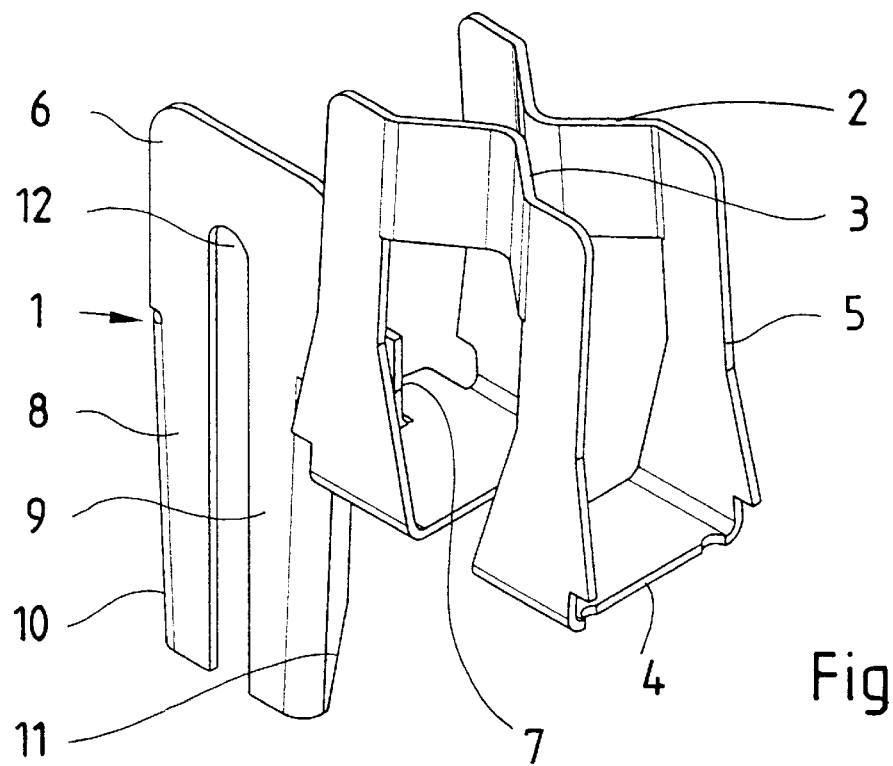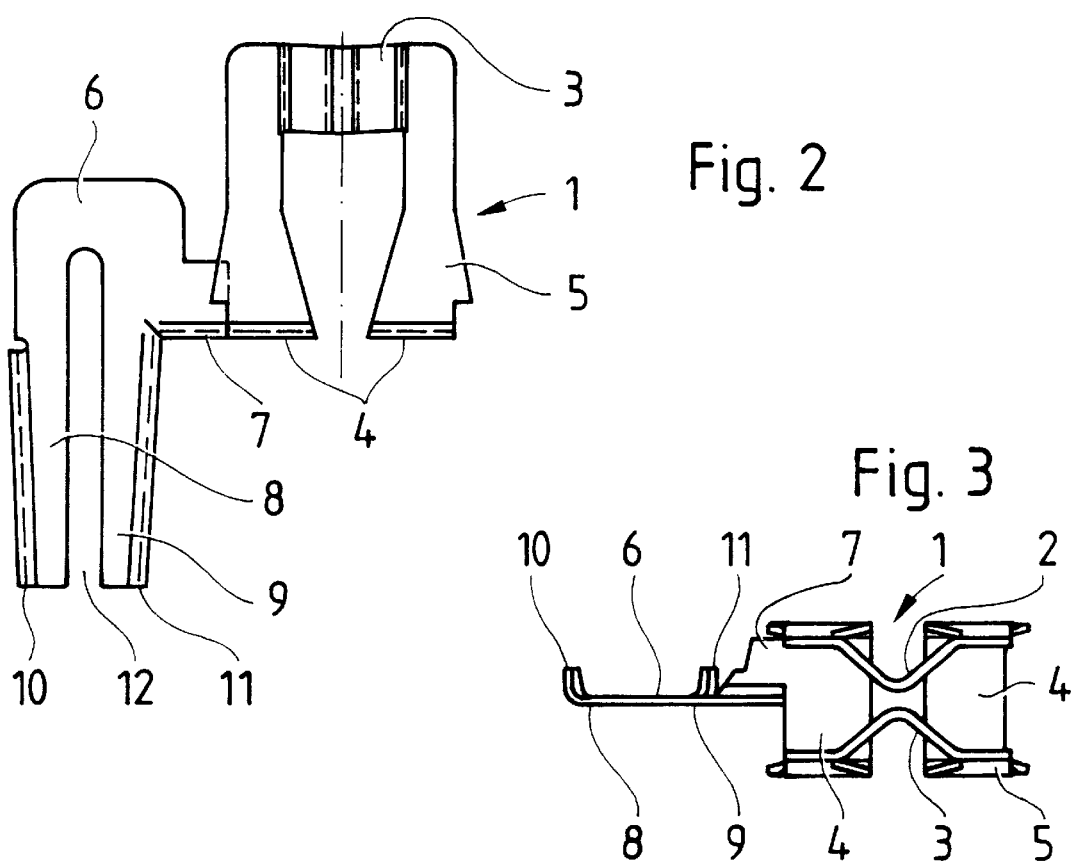

CONTACT ELEMENT FOR ELECTRICAL CONTACT OF PRINTED CIRCUIT BOARDS TO A FRONT MODULE RAIL OF A MODULE SUPPORT STRUCTURE

BACKGROUND OF THE INVENTION

The invention concerns a contact element for electrical contact of printed circuit boards to a front module rail of a module support structure or a module support structure housing means. A contact element of this kind is mounted to the forward region of a guide rail which has a guide groove for insertion of a printed circuit board and which can be inserted into at least one positioning hole of the module rail. It comprises at least one leaf spring elastically seated on the inserted printed circuit board, a contact means effecting an electrical contact to the module rail and a connecting piece between the leaf spring and the contact means.

Guide rails for the insertion of printed circuit boards, having electrical or electronic components, into module support structures or into module support structure housing means are usually made from plastic. As long as a printed circuit board is not inserted in the rear plug connector of the module support structure, interfering potential differences between the printed circuit board and the module support structure, occurring e.g. due to electrostatic charge-up of the printed circuit board, cannot be compensated for due to the non-conducting plastic of the guide rail. However, the printed circuit boards first come into electrical contact with the connector plug of the module support structure when they are nearly completely inserted. Moreover, an uncontrolled potential compensation at the plug connector is undesirable, since sensitive electronic components could thereby be damaged.

In order to avoid the above mentioned problem when inserting printed circuit boards in guide rails of module support structures, contact elements are mounted to the front region of the guide rails to establish electrical contact between the inserted printed circuit board and a front module rail. These contact elements usually consist essentially of a leaf spring and a contact means, connected via a connecting piece. When inserting the printed circuit board, the leaf spring resiliently seats on potential compensation leads in the printed circuit board and the contact means seats on the module rail. In many cases, an advance potential compensation between a printed circuit board and a front module rail, and thereby the module support structure, is thereby already established when the printed circuit board is inserted. No potential difference is therefore present between the printed circuit board and the module support structure when contact is made with the plug connector.

A contact element of the above mentioned kind is known in the art from DE 296 02 428 U1. The contact element described therein is divided into a clamping region and a holding region, wherein the clamping region comprises two leaf springs between which a printed circuit board is inserted and the holding region is snapped onto the front lower module rail of a module support structure.

Known in the art from EP 0 399 091 B1 is a contact element of the above mentioned kind. The contact element described herein has two leaf springs which seat, in the form of a U-shaped clip, in the guide groove of a guide rail as well as a contact means which is connected to the leaf springs via a connecting member engaging over the side legs of the guide rail and achieves electrical contact with the module rail via a formed contact spike pressed onto the surface of the module rail.

The contact elements of prior art have the common feature that the contacting with the module rail is unsatisfactory, at least when the module rail is made from aluminum and has an anodized surface. Since anodized aluminum surfaces are durable and insensitive, profile structured rails, normally made from aluminum, having anodized surfaces are nevertheless preferred.

SUMMARY OF THE INVENTION

It is therefore the underlying purpose of the invention to improve a contact element of the above mentioned kind in such a manner that a secure advance potential compensation between a printed circuit board and a front module rail of a module support structure is guaranteed when inserting the printed circuit board even if the module rail has an anodized surface.

This purpose is achieved with a contact element having the features of claim 1.

Advantageous embodiments and improvements in the invention can be derived from claims 2 through 7.

In accordance with the invention, the contact means of the contact element is essentially U-shaped and, together with the guide rail, can be inserted and clamped in one of the positioning holes of the module rail. Both U-legs of the contact means taper towards their ends and can be elastically deformed relative to each other. This configuration of the contact means allows the outer edges of the U-legs to be easily initially introduced into the corresponding positioning hole of the module rail. When the contact means is pushed further in, the outer edges of the U-legs contact the inner edges of the positioning hole, to increase the pressing pressure during further insertion. The U-legs, which can be resiliently deformed, thereby guarantee that the contact means does not jam along the way.

The movement of the outer edges of both U-legs along and on the inner edges of the positioning hole and the simultaneous associated pressing force effect, in any event, an excellent electrical contact between the contact means and the module rail even when the module rail has an anodized surface.

In addition, the positioning holes are normally stamped out after the module rail is anodized so that their inner edges do not have an anodized layer. It is therefore particularly advantageous when the contact means of the contact elements seat on the inside edges of the positioning holes.

The outer sides of the U-legs of the contact means each preferentially have a sharp-edge which penetrates into the surface of the inside edges of the positioning hole. This sharp edge can e.g. be a punching burr which occurs in any event if the contact element is punched-out.

The stability of the contact means is increased when the U-legs are bent-away at their outer sides. In this manner higher pressing forces can be achieved between the outer edges of the U-legs and the inner edges of the positioning holes.

The guide rails to which the contact elements in accordance with the invention are mounted usually have catch hooks which are inserted into the positioning holes of the module rails to hold the guide rails in place. It is thereby particularly advantageous when the contact means has the shape of this catch hook and can be inserted together therewith into one of the positioning holes of the module rail. The U-legs of the contact means can cover and thereby flank the side edges of the catch hook. In this manner, the function of the catch hook is not impaired by the contact means of the contact element.

The contact element in accordance with the invention can have two leaf springs which, together with a bottom element which connects them, form a U-shaped resilient means. This resilient means advantageously seats in openings of the guide groove in the guide rail to thereby engage around the lower edge of the printed circuit board during insertion. The two leaf springs thereby rub along the printed circuit board when same is inserted into the guide rail.

It is particularly advantageous from a manufacturing stand point when the contact element in accordance with the invention is made from punched sheet metal which is subsequently bent a plurality of times.

An embodiment of the invention is described more closely below with reference to the drawings.

BRIEF DESCRIPTION OF THE DRAWINGS

FIG. 1 shows a perspective view of a contact element;

FIG. 2 shows a side view of a contact element;

FIG. 3 shows a plan view of a contact element;

DESCRIPTION OF THE PREFERRED EMBODIMENT

Figure 4:
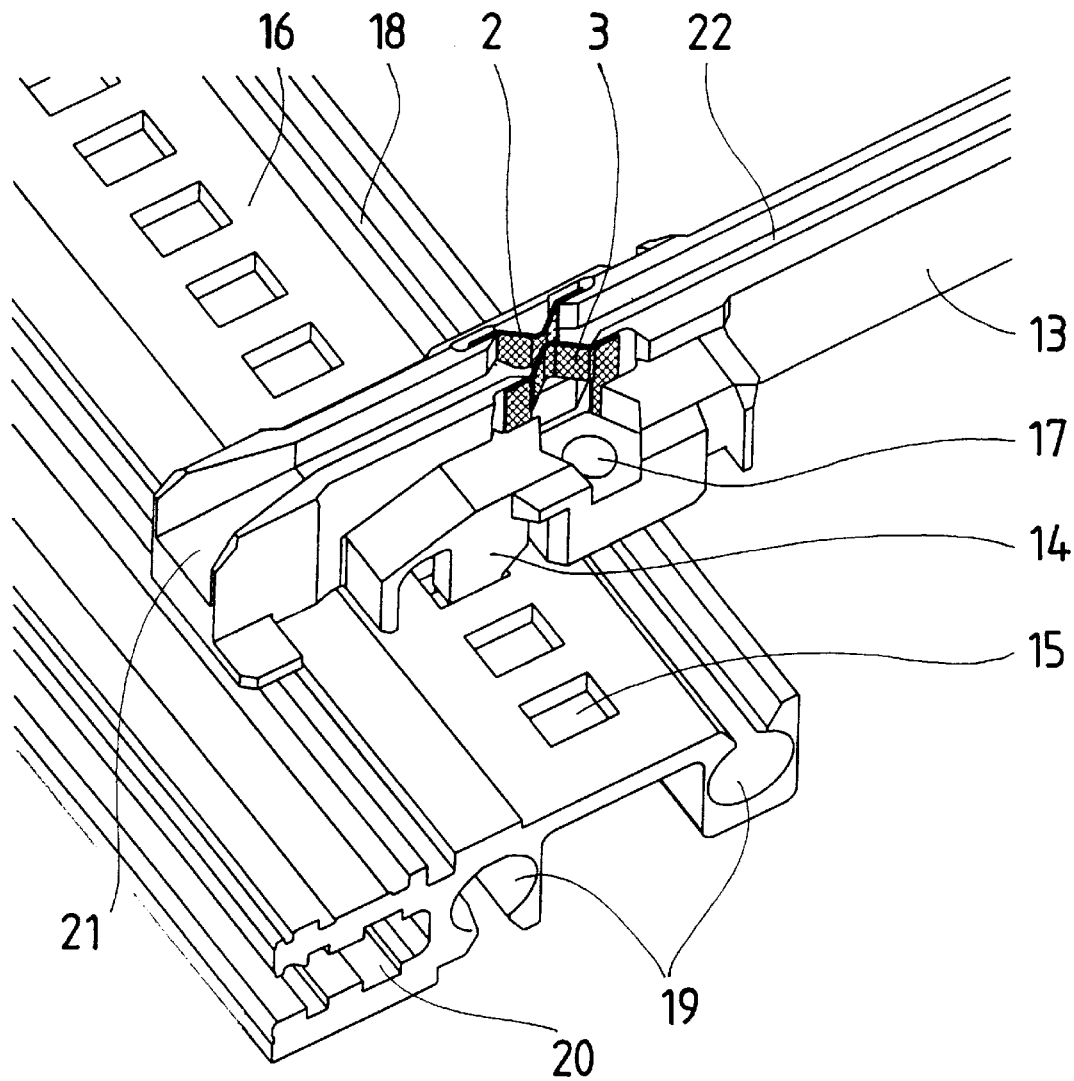
FIG. 4 shows a perspective view from above of a guide rail inserted into a module rail and having a contact element.

The contact element 1 shown in FIG. 1 consists essentially of a left leaf spring 2 and a right leaf spring 3 connected via bottom element 4 to form a U-shaped resilient means 5 together therewith, as well as a contact means 6 cooperating with the resilient means 5 via a connecting piece 7. The contact means 6 is U-shaped and has a front U-leg 8 as well as a back U-leg 9. Both U-legs 8,9 are bent-off at right angles at their outer edges 10,11. A slot 12 of the contact means 6 is dimensioned in such a manner that that the front U-leg 8 and the back U-leg 9 can be resiliently pressed together.

In the side view of the contact element 1 shown in FIG. 2, one can see that the bottom element 4 of the resilient means 5 has two parts for fitting into a guide rail (not shown here).

FIG. 2 also clearly shows that both U-legs 8,9 of the contact means 6 are downwardly tapered in such a manner that the outer edges 10,11 both deviate by about 2.5 angular degrees from the vertical.

FIG. 3, a plan view of contact element 1, clearly shows that the left leaf spring 2 and the right leaf spring 3 define an intermediate gap through which a printed circuit board (not shown) is inserted and thereby electrically contacted. The bends in both outer edges 10,11 of the U-legs 8,9 of the contact means 6 can also clearly be seen in FIG. 3.

FIG. 4 is a perspective view of a guide rail 13 inserted, with a catch hook 14, into a positioning hole 15 of a module rail 16. The guide rail 13 is bolted to the module rail 16 via a bore hole 17 and a mounting groove 18. Two threaded holes 19 serve for mounting the module rail 16 to a side wall. A forwardly opened groove 20 is located on the front side of the module rail 16 into which a threaded strip (not shown) can be inserted for mounting of a front plate (likewise not shown).

A printed circuit board is then placed into a slanted lead 21 and is inserted along a guide groove 22 of the guide rail 13. It is thereby guided through between the left leaf spring 2 and the right leaf spring 3 of the contact element 1 inserted into the guide rail 13. The leaf springs 2,3 seat resiliently on the printed circuit board and electrically contact same.

Figure 5:
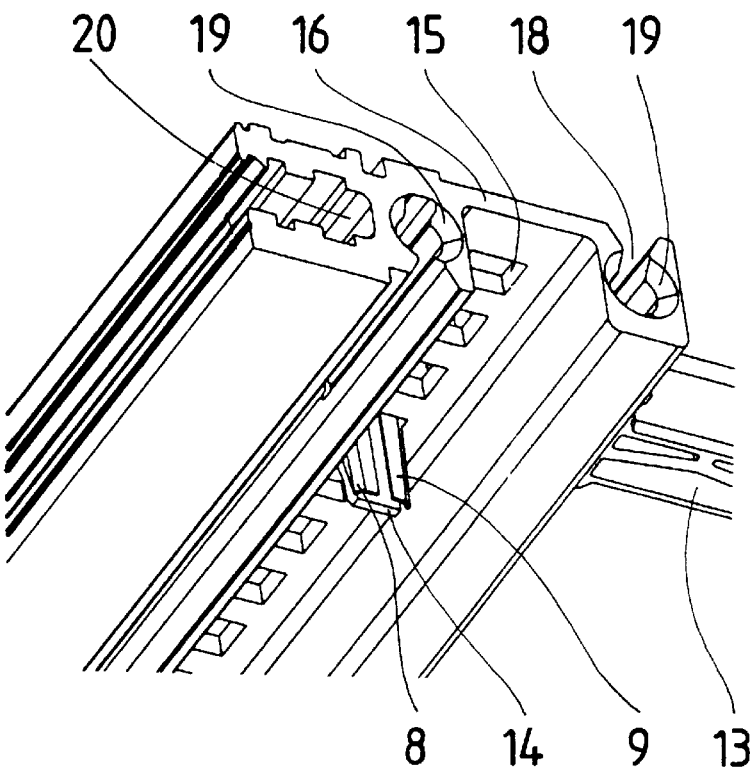
FIG. 5 shows a representation such as that of FIG. 4, however a perspective view from below.

FIG. 5 shows the configuration of FIG. 4 from another perspective. One clearly sees how the catch hook 14 of the guide rail 13 seats in a positioning hole 15 of the module rail 16. The two U-legs 8,9, of the contact means 6 of the contact element 1 are inserted, together with the catch hook 14, into the positioning hole 15. The outer edges 10,11 of the two U-legs 8,9 are thereby clamped within the inner edges of the positioning hole 15 to effect the electrical contact with the module rail 16. The two U-legs 8,9 are shaped in such a manner that they flank the catch hooks 14 at the sides and thereby do not impair their function.

Figure 6:
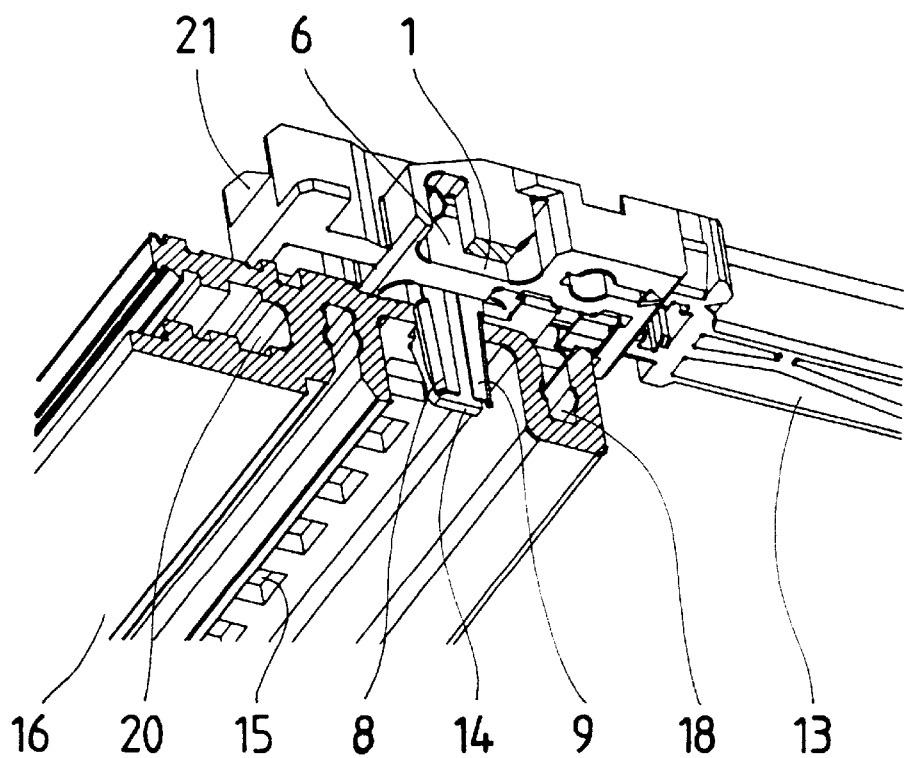
FIG. 6 shows a partial cut representation in correspondence with FIG. 5.

FIG. 6 shows a cut representation of the configuration of FIG. 5 from the same view direction. The parallel configuration of the catch hook 14 and the two U-legs 8,9 of the contact element 1 can be seen even more clearly here.

Figure 7:
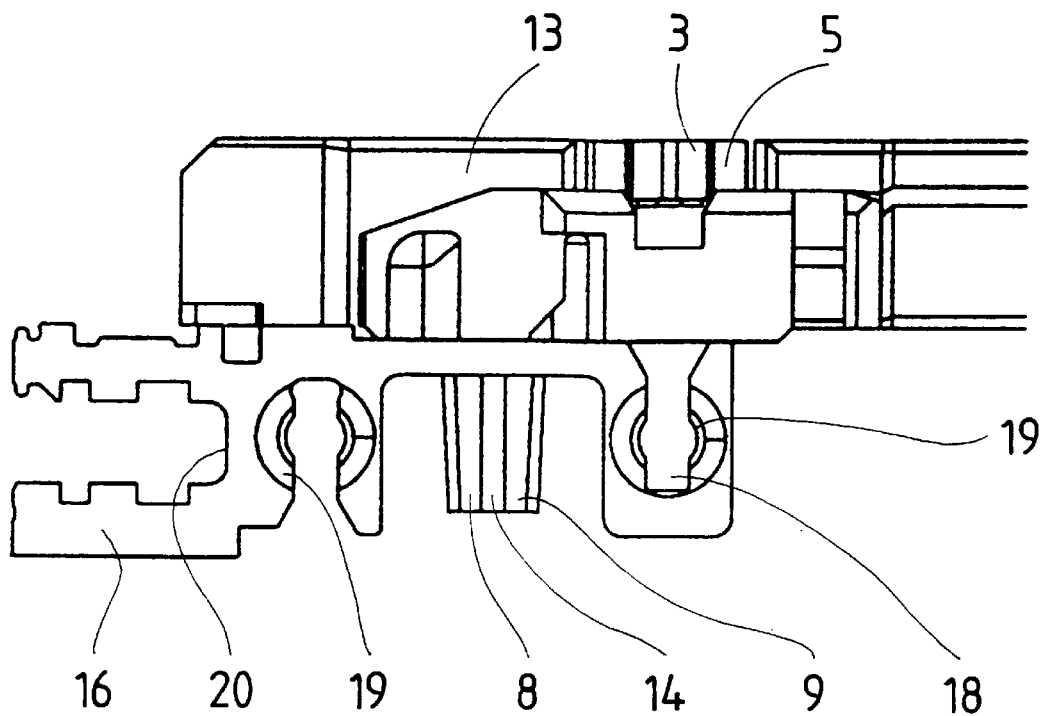
FIG. 7 shows a representation such as FIG. 4, however a side view.

FIG. 7 shows a side view of the configuration also shown in FIGS. 4 through 6. The guide rail 13 is placed onto the module rail 16 via its catch hook 14. At the upper edge of the guide rail 13, is the right leaf spring 3 of the resilient means 5 which are integral with the U-legs 8,9 of the contact means 6 at the catch hook 14. In this manner, an electrical contact between the printed circuit board (not shown) and the module rail 16 is effected.

Summary of the Reference Symbols 1 contact element
2 leaf spring (left)
3 leaf spring (right)
4 bottom element
5 resilient means
6 contact means
7 connecting piece
8 U-leg (front)
9 U-leg (back)
10 outer edge (of 8)
11 outer edge (of 9)
12 slot (of 6)
13 guide rail
14 catch hook
15 positioning hole
16 module rail
17 bore hole
18 mounting grove
19 threaded hole
20 groove
21 slanted lead
22 guide groove

What is claimed is:

1. A contact element for electrical contact of a printed circuit board to a front module rail of a module support structure, the front module rail extending in a transverse direction of the module support structure, the contact element mounting to a forward region of a guide rail, the guide rail having a guide groove extending in a longitudinal direction of said support structure, perpendicular to the front module rail, the guide rail seating on the front module rail and having a connection arm projecting below the guide rail to engage a positioning hole of the module rail, the contact element comprising:

a U-shaped resilient member seating with the guide rail, said resilient member having a first side with a first leaf spring member projecting into the guide rail groove at a first side of the guide rail, a second side with a second leaf spring member for projecting into the guide rail groove at a second side of the guide rail opposite the first side, and a bottom member mechanically and electrically connecting said first leaf spring member to said second leaf spring member, said first and second leaf spring members electrically contacting the printed circuit board when the printed circuit board is inserted into the guide groove between said first and said second leaf spring members;

a U-shaped contact member extending in a downward direction away from said bottom member of said resilient member, said contact member having a first leg tapering in a downward direction towards an end thereof, a second leg tapering in a downward direction towards an end thereof, and a slot separating said first leg from said second leg, said U-shaped contact member shaped to seat on an outside surface of the guide rail connection arm; and a connecting piece electrically and mechanically connecting said contact member to said resilient member, wherein said contact member inserts together with the connection arm, into the module rail positioning hole to press outwardly with said first and second legs against an inner surface of the module rail positioning hole to establish electrical contact between the module rail and the printed circuit board.

2. The contact element of claim 1, wherein the first and second legs of the contact member have outer edges that are perpendicular to the first and second legs.

3. A contact element according to claim 1, wherein the first leg and the second leg each includes a planar portion, and wherein the planar portions are positioned in a side by side coplanar arrangement.

4. A contact element according to claim 1, wherein the leaf spring members bow inward toward one another.

\* \* \* \* \*